United States Patent
Khoueir et al.

(10) Patent No.: US 8,154,088 B1
(45) Date of Patent: Apr. 10, 2012

(54) SEMICONDUCTOR TOPOGRAPHY AND METHOD FOR REDUCING GATE INDUCED DRAIN LEAKAGE (GIDL) IN MOS TRANSISTORS

(75) Inventors: Antoine Khoueir, Apple Valley, MN (US); Subhash Srinivas Pidaparthi, Apple Valley, MN (US); Henry Jim Fulford, Meridian, ID (US)

(73) Assignee: Cypress Semiconductor Corporation, San Jose, CA (US)

( * ) Notice: Subject to any disclaimer, the term of this patent is extended or adjusted under 35 U.S.C. 154(b) by 1056 days.

(21) Appl. No.: 11/860,245

(22) Filed: Sep. 24, 2007

Related U.S. Application Data

(60) Provisional application No. 60/827,606, filed on Sep. 29, 2006.

(51) Int. Cl.
- *H01L 27/088* (2006.01)
- *H01L 21/338* (2006.01)
- *H01L 21/84* (2006.01)
- *H01L 21/8238* (2006.01)
- *H01L 21/336* (2006.01)
- *H01L 21/425* (2006.01)

(52) U.S. Cl. ......... 257/401; 257/E29.122; 257/E21.619; 257/E21.626; 257/E21.634; 438/163; 438/184; 438/230; 438/303; 438/514

(58) Field of Classification Search ............... 438/181, 438/184–185, 229–231, 299, 301, 303–306, 438/595, 596, 302, 369, 370, 373, 506, 514, 438/519, 527, 163; 257/282, 287, 369, 401, 257/E29.122, E21.433, E21.454, E21.619, 257/E21.626, E21.634
See application file for complete search history.

(56) References Cited

U.S. PATENT DOCUMENTS

| | | | |
|---|---|---|---|
| 5,821,146 A * | 10/1998 | Chang et al. | 438/299 |
| 6,090,671 A | 7/2000 | Balasubramanyam et al. | |
| 6,107,130 A * | 8/2000 | Fulford et al. | 438/231 |
| 6,255,180 B1 * | 7/2001 | Smith | 438/301 |
| 6,350,665 B1 * | 2/2002 | Jin et al. | 438/585 |
| 6,486,033 B1 * | 11/2002 | Tu et al. | 438/275 |
| 6,548,363 B1 | 4/2003 | Wu et al. | |
| 6,670,251 B2 | 12/2003 | Fukada et al. | |
| 6,693,012 B2 | 2/2004 | Mouli et al. | |
| 6,765,252 B2 | 7/2004 | Nam | |
| 6,855,590 B2 | 2/2005 | Seo et al. | |
| 6,855,604 B2 | 2/2005 | Lee | |
| 6,878,582 B2 | 4/2005 | Dokumaci et al. | |
| 7,149,126 B2 * | 12/2006 | Ogura et al. | 365/185.29 |
| 2002/0086490 A1 * | 7/2002 | Fukada et al. | 438/373 |
| 2006/0079051 A1 * | 4/2006 | Chindalore et al. | 438/257 |

* cited by examiner

*Primary Examiner* — Charles Garber
*Assistant Examiner* — Calvin Choi

(57) ABSTRACT

Improved semiconductor topographies and methods are provided herein for reducing the gate induced drain leakage (GIDL) associated with MOS transistors. In particular, a disposable spacer layer is used as an additional mask during implantation of one or more source/drain regions. The physical spacing between the gate and the source/drain regions of a MOS transistor (i.e., the gate/drain overlap) can be varied by varying the thickness of the disposable spacer layer. For example, a larger spacer layer thickness may be used to decrease the gate/drain overlap and reduce the GIDL associated with the MOS transistor. The disposable spacer layer is completely removed after implantation to enable electrical contact between the source/drain regions and subsequently formed source/drain contacts. A method is also provided herein for independently customizing the amount of current leakage associated with two or more MOS transistors.

13 Claims, 4 Drawing Sheets

US 8,154,088 B1

SEMICONDUCTOR TOPOGRAPHY AND METHOD FOR REDUCING GATE INDUCED DRAIN LEAKAGE (GIDL) IN MOS TRANSISTORS

PRIORITY CLAIM

The present application claims priority to U.S. Provisional Application No. 60/827,606 filed Sep. 29, 2006.

BACKGROUND OF THE INVENTION

1. Field of the Invention

This invention relates to semiconductor device manufacturing and, more particularly, to an improved manufacturing method for reducing gate induced drain leakage (GIDL) within MOSFETs.

2. Description of the Related Art

The following descriptions and examples are given as background only.

Current trends within integrated circuit technologies involve reducing the feature dimensions within integrated circuits to increase performance. For instance, the length, width and (sometimes) depth of various features within a metal oxide semiconductor field effect transistor (MOSFET) may be reduced to increase performance and the density of integration within a semiconductor device. In one application, scaling down features within random access memories has allowed cell sizes to shrink, in effect enabling larger memory sizes, lower cost per bit and improved speed.

However, the continuous scaling of feature dimensions has led to shorter and shorter channel lengths within MOS transistors. As described in more detail below, a short channel length may cause significant current leakage between the gate and drain regions of the MOSFET, even though a voltage lower than the threshold voltage is applied to the gate of the MOSFET. A high current leakage leads to high power consumption in the standby condition, and thus, is very undesirable.

One approach for fabricating a MOSFET is shown in FIG. 1. In particular, FIG. 1 depicts a partial cross-sectional view of semiconductor topography 100 in which a pair of gate structures 110a and 110b are patterned upon semiconductor layer 120. As is known in the art, semiconductor layer 120 may be doped n-type, p-type or both. For example, semiconductor layer 120 may be doped n-type to form PMOS transistors or p-type to form NMOS transistors. In addition, semiconductor layer 120 may include isolation regions 130. Although not shown, an isolation region may also be interposed between the gate structures. For example, an isolation region may be interposed between gate structures 110a and 110b to form a pair of CMOS transistors. In such an embodiment, one side of the isolation region may be doped n-type to form a PMOS transistor, while the other side is doped p-type to form an NMOS transistor.

In general, the gate structures may be formed by patterning one or more layers. For example, the gate structures may be formed by depositing and patterning one or more conductive materials 114, such as doped amorphous silicon, doped polysilicon, titanium, tungsten, or any metal alloy, nitride or silicide thereof. In some embodiments, the gate structures may include a dielectric cap material 116 to isolate the conductive material(s) 114 from overlying layers and structures. In addition, the gate structures may include a gate dielectric layer 112 interposed between the conductive material(s) 114 and semiconductor layer 120. The gate dielectrics and cap layers may be composed of the same or different materials and may generally include one or more dielectric materials such as silicon dioxide, silicon nitride, silicon oxynitride, or other dielectric materials with a relatively high dielectric constant.

Next, dielectric sidewall spacers 118 may be formed upon the sidewall surfaces of the gate structures. The dielectric sidewall spacers 118 may be used to form graded junctions (i.e., active areas) within the substrate on opposite sides of a gate structure. In most cases, graded junctions are formed by first implanting a light concentration of dopant self-aligned to the sidewall surfaces of the gate structure prior to forming the dielectric sidewall spacers. After the sidewall spacers are formed, a heavier concentration of dopant self-aligned to the outer lateral surfaces of the spacers may be forwarded into the substrate. The purpose of the first implant is to produce lightly doped source/drain regions 140 within the substrate. These lightly doped diffusion regions straddle a channel region 150 formed directly underneath the gate structure. The second implant forms heavily doped source/drain regions 160 within the substrate. Together, the lightly doped 140 and heavily doped 160 source/drain regions form graded junctions, which increase in dopant concentration in a lateral direction away from the gate structure. As shown in FIG. 1, the heavily doped source/drain regions 160 may be laterally spaced from the channel region 150 by a distance, which is dictated by the thickness of the sidewall spacer 118 and the diffusion length.

After the dopant implants, the semiconductor topography 100 may be annealed to activate the dopants within the source/drain regions. In many cases, the anneal process includes a rapid thermal anneal (RTA) process in which the semiconductor topography is exposed to relatively high temperatures for a short period of time, such as between approximately 800° C. and approximately 1100° C. for less than a minute and, in some cases, for approximately 20 seconds. However, the RTA process may increase the diffusion of the source and drain regions, causing the regions to extend wider and deeper than allowed by the design specifications of the ensuing device, particularly as feature dimensions are scaled down for newer technologies.

In some cases, a relatively short distance may exist between the gate and the source/drain diffusion regions of a subsequently formed MOSFET. The relatively short distance may introduce a significant leakage current between the gate and drain regions of the MOSFET. In other words, a tunneling current may be generated between the drain region and its adjacent channel region even when the MOSFET is in an "off" state. This tunneling current is referred to as gate induced drain leakage (GIDL) and is typically dependent on the amount of gate/drain overlap (i.e., the amount of overlap capacitance) within the MOSFET device. Large GIDL currents increase the current consumption of the MOSFET in standby mode and may even cause premature transistor breakdown, which leads to low yield.

Several methods have been proposed to reduce the amount of gate induced drain leakage (GIDL) within a MOS transistor. For example, methods have been proposed to increase the thickness of the gate dielectric layer, increase the width of the dielectric sidewall spacers and/or change the concentration of the channel or source/drain implantations. However, these methods tend to change the threshold voltage, violate design rules or increase the overall size of the MOS transistor. In addition, these methods cannot be used to reduce the gate/drain overlap without effecting nearby transistors.

Therefore, a need remains for an improved semiconductor topography and method for reducing gate induced drain leakage (GIDL) within a MOS transistor. Preferably, an improved semiconductor topography and method in accordance with the present invention will reduce GIDL in a MOS transistor while overcoming the disadvantages of conventional methods.

SUMMARY OF THE INVENTION

The following description of various embodiments of semiconductor topographies and methods is not to be construed in any way as limiting the subject matter of the appended claims.

According to one embodiment, a method is provided herein for processing a semiconductor topography. In some cases, the processing method described herein may be used for reducing the amount of gate induced drain leakage (GIDL) within MOS transistors. The method may begin, for example, by forming one or more gate structures upon a semiconductor layer. However, one skilled in the art will recognize that other processing steps may actually precede the formation of gate structures. Next, the method may form spacers (i.e., sidewall spacers) adjacent to sidewalls of the one or more gate structures. The formation of gate structures and sidewall spacers may be performed an accordance with various deposition and etch techniques known in the art of semiconductor fabrication.

Sometime after the gate structures and associated sidewall spacers are formed, the method may deposit a disposable spacer layer upon the semiconductor topography. For example, the disposable spacer layer may be deposited upon the one or more gate structures, the sidewall spacers and adjacent portions of the semiconductor layer. The disposable spacer layer may be deposited by substantially any deposition process known in the art of semiconductor fabrication. In addition, the disposable spacer layer may be deposited to a first depth or thickness. In one embodiment, the disposable spacer layer may be deposited (or otherwise formed) to a first depth of about 50 Å to about 500 Å. Furthermore, the disposable spacer layer may include substantially any conductive or dielectric material, whose selectivity differs from that of the underlying gate structures and sidewall spacers. This enables the disposable spacer layer to be easily removed during a subsequent cleaning process tailored for removing an entirety of the disposable spacer layer.

In some cases, the method may continue by implanting a first set of dopants into the semiconductor layer to form a first set of source and drain regions for at least one of the gate structures. The first set of source and drain regions may correspond to lightly-doped diffusion (LDD) regions, medium-doped diffusion (MDD) regions or highly-doped diffusion (HDD) regions. Regardless of diffusion strength, the boundaries of the first set of source/drain regions may be laterally spaced from the sidewalls of the at least one gate structure by a distance determined (at least in part) by a combined thickness of the disposable spacer layer and a sidewall spacer formed adjacent to the at least one gate structure. In other words, the first set of source/drain regions may be formed by using the sidewall spacers of the at least one gate structure and the disposable spacer layer as an implant mask. In some cases, the method may mask a portion of the semiconductor topography prior to the step of implanting, such that the first set of dopants are implanted around only one of the gate structures. In other cases, the masking step may be configured for implanting the first set of dopants around two or more of the gate structures, or eliminated for blanket implanting the first set of dopants around all gate structures.

In some cases, after the step of implanting and before the step of removing, the method may include altering a thickness of the disposable spacer layer, masking a portion of the semiconductor topography comprising the at least one gate structure and the first set of source and drain regions, and implanting a second set of dopants into the semiconductor layer to form a second set of source and drain regions. Unlike the first set, the boundaries of the second set of source/drain regions may be laterally spaced from the sidewalls of a second gate structure by a distance determined (at least in part) by a combined thickness of the altered disposable spacer layer and a sidewall spacer formed adjacent to the second gate structure. In other words, the second set of source/drain regions may be formed by using the sidewall spacers of the second gate structure and the altered disposable spacer layer as an implant mask.

In some cases, the thickness of the disposable spacer layer may be reduced to reduce the lateral spacing between the second gate structure and the second set of source/drain regions (compared to the lateral spacing between the at least one gate structure and the first set of source/drain regions). In other cases, the thickness of the disposable spacer layer may be increased to increase the lateral spacing between the second gate structure and the second set of source and drain regions. The method may (or may not) continue by repeating the steps of altering, masking and implanting to form one or more additional sets of source and drain regions.

Once implantation is complete, the semiconductor topography may be annealed and the disposable spacer layer may be removed prior to forming one or more contact structures on the topography. In one embodiment, the disposable spacer layer may be removed with a wet or dry cleaning step, which is configured for removing more than an intended deposition thickness of the disposable spacer layer. By guaranteeing that the disposable spacer layer is completely removed before the one or more contact structures are formed, the cleaning step ensures good electrical contact between the contact structures and underlying structures. Complete removal of the disposable spacer layer may be especially important when self-aligned contacts (SAC) are formed upon the gate structures.

BRIEF DESCRIPTION OF THE DRAWINGS

Other objects and advantages of the invention will become apparent upon reading the following detailed description and upon reference to the accompanying drawings in which.

Figure 1:
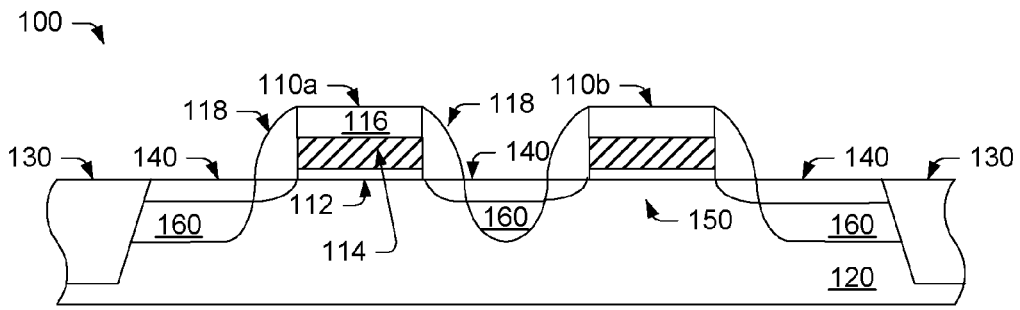
FIG. 1 is a partial cross-sectional view of a conventional semiconductor topography in which lightly doped diffusion regions are formed laterally adjacent to the gate structures and heavily doped diffusion regions are formed laterally adjacent to sidewall spacers of the gate structures.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
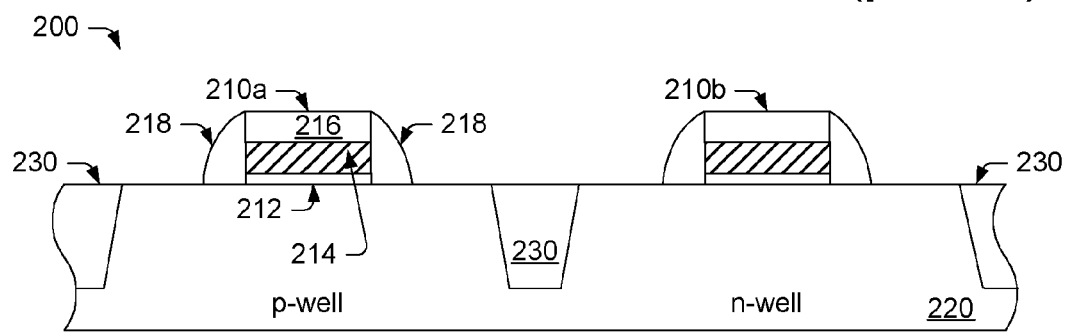
FIG. 2 is a partial cross-sectional view of an exemplary semiconductor topography in which two gate structures and associated sidewall spacers are formed upon a semiconductor layer.
Figure 3:
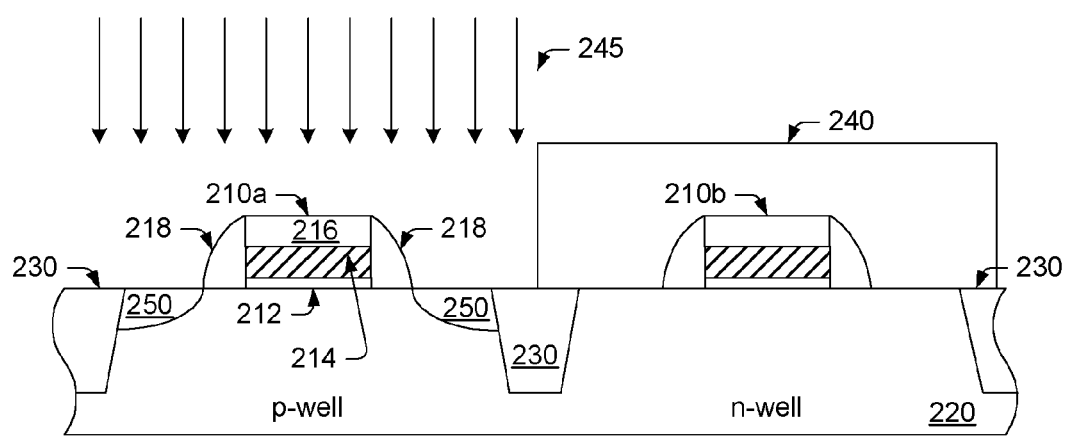
FIG. 3 is a partial cross-sectional view of the semiconductor topography of FIG. 2 in which diffusion regions are formed within an NMOS transistor side by masking off the PMOS transistor side and using the sidewall spacers as a mask during implantation of the NMOS transistor.

Various embodiments of an improved semiconductor topography and method for reducing gate induced drain leakage (GIDL) in MOS transistors are illustrated in FIGS. 2-12. For example, FIGS. 2-6 illustrate an exemplary method for reducing GIDL in PMOS transistors. As described in more detail below, the exemplary method deposits a disposable spacer layer over the semiconductor topography after forming the gate structures and associated sidewall spacers. In some cases, the disposable spacer layer may be deposited after forming diffusion regions in an NMOS side of the topography, as shown in FIG. 3. After masking the NMOS side, diffusion regions are formed in a PMOS side of the topography using the sidewall spacers and disposable spacer layer as an implant mask. A similar method may be used for reducing GIDL in NMOS transistors.

However, the method is not limited to the formation of adjacent NMOS and PMOS transistors. In one alternative embodiment, the method described herein may be adapted for customizing substantially any number and type of MOS transistors. For example, FIGS. 7-12 illustrate an exemplary method for customizing the formation of diffusion regions within two or more MOS transistors using the same disposable spacer layer. It is worth noting, however, that the method is not limited to MOS technologies, and may be adapted for other process technologies (e.g., bipolar, SONOS, etc.) and transistor architectures, which would benefit from such a method.

FIG. 2 depicts a partial cross-sectional view of semiconductor topography 200 in which a pair of gate structures 210a and 210b are patterned upon semiconductor layer 220. In some embodiments, semiconductor layer 220 may be a silicon-based substrate, such as a monocrystalline silicon, silicon-germanium, silicon-on-insulator, or silicon-on-sapphire substrate. Alternatively, semiconductor layer 220 may include an epitaxial layer arranged upon an interlevel dielectric, forming a silicon-on-insulator (SOI) base on which structures and layers may be formed. In any case, semiconductor layer 220 may be doped n-type, p-type or both. In addition, semiconductor layer 220 may include one or more isolation regions 230.

In the particular embodiment of FIG. 2, isolation regions 230 are formed within the semiconductor layer 220 on either side and between gate structures 210a and 210b. In some cases, CMOS transistors may be formed by doping the semiconductor layer 220, such that a p-well is formed within the active region intended for an NMOS transistor and an n-well is formed within the active region intended for a PMOS transistor. As noted above, however, the methods disclosed herein are not limited to the formation of adjacent NMOS and PMOS transistors. Instead, the method may be adapted for customizing two or more NMOS transistors, two or more PMOS transistors, an NMOS (or PMOS) transistor and a low voltage FET (LVFET), or an NMOS (or PMOS) transistor and a high voltage FET (HVFET).

In general, gate structures 210a and 210b may be formed by depositing and patterning one or more layers. In some embodiments, for example, gate structures 210a and 210b may be formed by patterning one or more conductive materials 214, such as doped amorphous silicon, doped polysilicon, titanium, tungsten, or any metal alloy, nitride or silicide thereof. In addition or alternatively, gate structures 28 may include one or more layers of undoped amorphous silicon or undoped polysilicon, which may be made conductive by a subsequent doping process, such as those used to form source and drain contact regions of the ensuing transistor. In some embodiments, the gate structures may include a dielectric cap material 216 to isolate the conductive material(s) 214 from overlying layers and structures. In some embodiments, the gate structures may include a gate dielectric layer 212 interposed between the conductive material(s) 214 and semiconductor layer 220. The gate dielectric and cap layers may be composed of the same or different materials and may generally include one or more dielectric materials such as silicon dioxide, silicon nitride, silicon oxynitride, or other dielectric materials with a relatively high dielectric constant (k).

After the gate structures are formed, a dielectric material may be deposited upon the semiconductor topography and patterned to form dielectric sidewall spacers 218 upon the sidewall surfaces of the gate structures. In general, sidewall spacers 218 may be formed by depositing a dielectric material, such as nitride, oxide and various high-k dielectrics over gate structures 210a and 210b and adjacent portions of the semiconductor topography. An exemplary deposition process which may be employed includes chemical vapor deposition (CVD). Other processing temperatures and/or deposition techniques, however, may be used to deposit the material. In one exemplary embodiment, a nitride material is deposited upon the semiconductor topography and etched to form sidewall spacers 218.

In any case, the deposited dielectric layer may be blanket etched to form sidewall spacers 218 along the sidewalls of gate structures 210a and 210b. Blanket etching, as used herein, may refer to an etch process which does not employ resist structures or hardmask features to pattern the topography. Since the dielectric material is conformably deposited over gate structures 210a and 210b, portions of the deposited layer will be thicker along the sidewalls of the structures. As such, the blanket etching process may be configured to terminate prior to removing the entirety of the layer, forming sidewall spacers 218 along the sidewalls of gate structures 210a and 210b. In some embodiments, the blanket etching process may be configured to anisotropically etch the layer, such that the outer sidewall surfaces of sidewall spacers 218 are formed with a convex profile extending between the upper surfaces of gate structures 210a and 210b and semiconductor layer 220, as shown in FIG. 2.

Subsequent to the formation of sidewall spacers 218, source and drain regions 250 may be formed within a p-well of semiconductor layer 220 to form the source/drain contacts for the NMOS transistor. For example, source/drain regions 250 may be formed by implanting dopants into semiconductor layer 220. The dopant implantation process may include a single implantation or a series of implantations. A series of implantations may be used to form graded junctions (e.g., LDD and HDD source and drain regions). In some embodiments, the dopants may be implanted into the entirety of semiconductor topography 200. In yet other embodiments, portions of semiconductor topography 200 may be masked prior to the dopant implantation to shield other portions of the semiconductor topography from the implantation. Such masking embodiments may be particularly applicable to circuit designs including CMOS transistors, such that transistors of different conductivity types (i.e., transistors having source and contact regions of different conductivity types) may be formed.

In the embodiment of FIG. 3, the PMOS side of the semiconductor topography is masked with a photoresist 240 before dopants 245 are implanted into the p-well of semiconductor layer 220 to form NMOS source/drain regions 250. Because sidewall spacers 218 act as an implant mask, the source and drain regions 250 are formed having boundaries in alignment with the outer surfaces of sidewall spacers 218. The dopants 245 used to form NMOS source/drain regions 250 may be implanted into the p-well at energies and doses, which are dependent on transistor performance requirements. Once source/drain regions 250 are formed, photoresist 240 is removed using a plasma or solvent clean process.

In some cases, it may be desirable to reduce the gate/drain overlap of the PMOS transistor without affecting the NMOS side. As noted above, for example, gate induced drain leakage (GIDL) may be introduced in MOS transistors when source/drain regions are formed too close to the gate. In order to reduce the effects of GIDL within the PMOS transistor without effecting the nearby NMOS (i.e., without thickening the gate dielectric 212 or widening the sidewall spacers 218), the present method uses a disposable spacer layer 260 as an additional implant mask. The disposable spacer layer reduces GIDL by physically increasing the lateral spacing between the gate and source/drain regions of the PMOS device. The disposable spacer layer 260 is later removed after a subsequent anneal process and before contact structures are formed upon the semiconductor topography.

Figure 4:
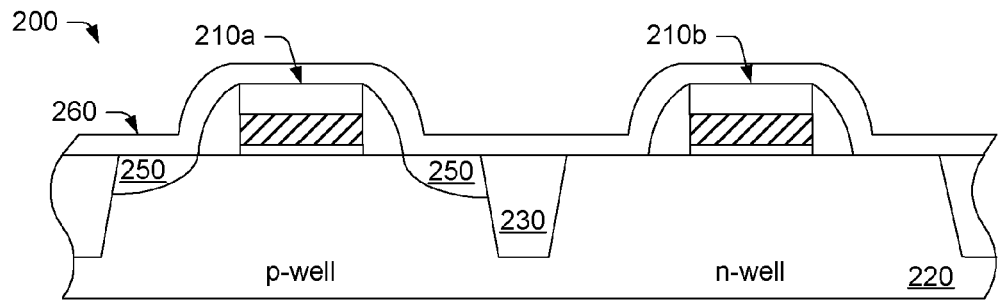
FIG. 4 is a partial cross-sectional view of the semiconductor topography of FIG. 3 in which a disposable spacer layer is deposited over the semiconductor topography.

As shown in FIG. 4, disposable spacer layer 260 may be deposited over the semiconductor topography after the mask, implant and photoresist removal steps shown in FIG. 3. In one embodiment, disposable spacer layer 260 may be a high temperature oxide (HTO) deposited to a depth of about 200 Å. However, disposable spacer layer 260 is not limited to a particular material composition, deposition process or deposition depth. In general, disposable spacer layer 260 may be deposited by substantially any deposition process (e.g., LPCVD, PECVD, among others) and to substantially any deposition depth (e.g., about 50 Å to about 500 Å or more depending on certain requirements). In addition, disposable spacer layer 260 may include substantially any conductive material (e.g., polysilicon) or dielectric material (e.g., oxide, nitride or silicon nitride), whose selectivity differs from that of sidewall spacers 218, dielectric cap material 216 and semiconductor layer 220. In other words, the material composition of disposable spacer layer 260 should be chosen so that it can be easily removed from the gate structures, sidewall spacers and semiconductor layer in a subsequent cleaning process.

After the disposable spacer layer 260 is formed, source and drain regions 280 may be formed on the PMOS side of the semiconductor topography. As noted above, the dopant implantation process may include a single implantation or a series of implantations. A series of implantations may be used, for example, when graded junctions are desired. In some embodiments, the dopants may be implanted into the entirety of semiconductor topography 200. In the illustrated embodiment, however, portions of semiconductor topography 200 are masked before implantation to shield other portions of the semiconductor topography from the dopants.

Figure 5:
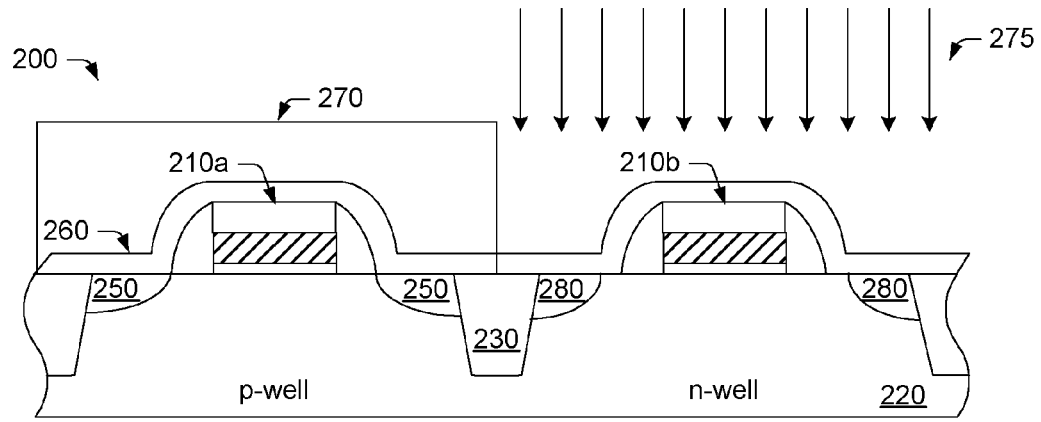
FIG. 5 is a partial cross-sectional view of the semiconductor topography of FIG. 4 in which diffusion regions are formed within a PMOS transistor side by masking off the NMOS transistor side and using the sidewall spacers and the disposable spacer layer as a mask during implantation of the PMOS transistor.

As shown in FIG. 5, for example, the NMOS side of the semiconductor topography may be masked with photoresist 270 before dopants 275 are implanted into the n-well of semiconductor layer 220 to form the source and drain regions 280 within the PMOS side. Unlike the previous implantation, source/drain regions 280 are laterally spaced away from the outer surfaces of the sidewall spacers 218 due to the inclusion of disposable spacer layer 260. In other words, disposable spacer layer 260 increases the physical spacing between the gate and the source/drain regions of the PMOS transistor by acting as an additional implant mask. The increased physical spacing is dependent on the deposition depth of disposable spacer layer 260, and thus, may be easily varied in accordance with the needs of a particular application or process.

In some cases, the deposition depth may be increased (e.g., up to about 500 Å or more) to space the source/drain regions 280 further away from the gate structures. In other cases, the deposition depth may be decreased (e.g., down to about 50 Å or less) to situate the source/drain regions 280 closer to the gate structures. In any case, the implantation energy used to form source/drain regions 280 is typically increased (e.g., from about 10% to about 150%) to compensate for the increase in implant mask thickness (compared to the case in which sidewall spacers alone are used as an implant mask). In one embodiment, the implantation energy used to form source/drain regions 280 may be increased from about 13 keV to about 31 keV during a first implantation (to form LDD regions) and from about 35 keV to about 41 keV during a second implantation (to form HDD regions).

In some cases, the semiconductor topography 200 may be subjected to an anneal process to activate the dopants and eliminate any defects that may have been created during the implantation steps. In many cases, the anneal process includes a rapid thermal anneal (RTA) process in which the semiconductor topography is exposed to relatively high temperatures for a short period of time, such as between approximately 800° C. and approximately 1100° C. for less than a minute and, in some cases, for approximately 20 seconds. However, higher or lower temperatures and/or longer or shorter durations may be employed for the anneal process, depending on the design specifications of the topography. In some cases, the anneal process may be performed prior to the removal of disposable spacer layer 260 (discussed below). In other cases, the anneal process may be performed after the disposable spacer layer 260 has been removed.

As known in the art, the anneal process usually causes the diffusion regions to extend wider and/or deeper into the semiconductor layer 220. However, by using disposable spacer layer 260, the present method ensures that source/drain regions 280 will not extend beneath PMOS gate structure 210b. In other words, disposable spacer layer 260 may be used to reduce the effects of GIDL in the PMOS transistor by preventing excessive diffusion, and thus, reducing the post-anneal gate/drain overlap.

As noted above, disposable spacer layer 260 may be removed from the semiconductor topography before or after the anneal process. In one embodiment, the disposable spacer layer may be removed by increasing the clean time of a subsequent cleaning step. The cleaning step may include any wet or dry clean techniques used in the semiconductor fabrication industry for removing the disposable spacer layer without significantly etching the underlying structures of the semiconductor topography. In one example, the cleaning step may include exposing semiconductor topography 200 to a wet chemistry (e.g., HF for an oxide spacer layer) tailored to remove about 300 Å of disposable spacer layer 260 (when deposited to a depth of about 200 Å). Alternatively, the cleaning process may include exposing semiconductor topography 200 to a standard dry clean process using $CF_4$, $CHF_3$, or $O_2/Ar$ chemistry. In any case, the cleaning process should have a much higher selectivity to the disposable spacer layer than to underlying structures of the semiconductor topography. This enables the cleaning process to account for variations in deposition thickness and other process variations by tailoring the process to remove a substantially larger amount (e.g., about 300 Å) than the intended deposition thickness (e.g., about 200 Å) to ensure that the entire disposable spacer layer 260 is removed.

Once the disposable spacer layer 260 is removed, the fabrication sequence may continue (in FIG. 6) within the deposition of a dielectric layer (not shown) and the formation of contact openings through the dielectric layer exposing the gate contact regions (210a, 210b) and the source/drain contact regions (250, 280). The dielectric layer can be any suitable dielectric material having the desired electrical and mechanical properties. For example, the dielectric layer may include undoped silicon dioxide or lightly doped phosphosilicate glass (PSG). Other dielectric materials, however, may be employed. The contact openings may be formed using lithography and etch techniques known in the semiconductor fabrication industry.

Figure 6:
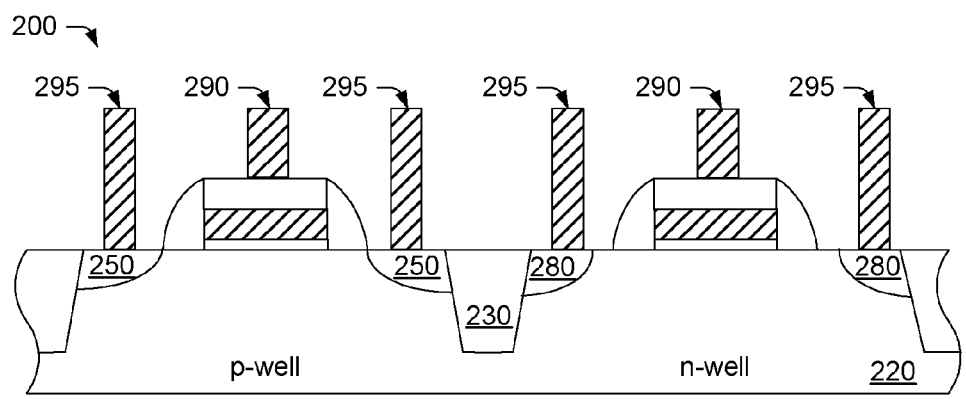
FIG. 6 is a partial cross-sectional view of the semiconductor topography of FIG. 5 in which source, drain and gate contacts are formed upon the semiconductor topography after the disposable spacer layer is removed.

In some embodiments, the dielectric layer may be etched using a $C_4F_6/O_2/Ar$ or $C_4F_8/CO/Ar$ chemistry. Such exemplary etch chemistries may be particularly applicable for embodiments in which the dielectric layer includes PSG and sidewall spacers 218 include silicon nitride. In any case, semiconductor topography 200 may, in some embodiments, be cleaned to remove any etch byproducts and photo resist remaining from the photolithographic process used to form masks for the contact opening etch. After etch, gate contacts 290 and source/drain contacts 295 may be formed by metal deposition of one or more layers, as shown in FIG. 6. The resulting surface of the substrate may then be polished. The contacts can be made from any suitable metal or other conductive material having the desired electrical and mechanical properties. One exemplary contact configuration includes a titanium/titanium-nitride liner and a tungsten plug.

Although not necessarily so restricted, the contact openings formed over the source and drain regions may be configured to form self-aligned contact (SAC) structures, in some embodiments of the invention. For example, the contact openings shown in FIG. 6 may, instead, be arranged directly adjacent to sidewall spacers 218, over portions of gate structures 210 and adjacent to portions of source/drain contact regions 250, 280. The removal of disposable spacer layer 260 is particularly important when forming contact openings for SAC structures. For example, consider the case in which disposable spacer layer 260 includes an undoped oxide. Because the etch chemistries used for etching PSG are more selective to undoped oxides, the etch process will stop before reaching an upper surface of the contact regions if any portion of the disposable layer 260 remains on the topography. This would prohibit the contact structures 290, 295 and the contact regions 250, 280 from making electrical contact, thereby rendering the device unusable. As such, the entire disposable spacer layer 260 must be removed prior to forming the contact structures on the semiconductor topography.

One embodiment of an improved semiconductor topography and method for reducing the amount of GIDL within a PMOS transistor has now been described. As indicated above, the improved method reduces PMOS current leakage with the addition of a single processing step (i.e., by adding a disposable spacer layer). In one implementation, the improved method may reduce PMOS current leakage by about 1.1 log A by depositing a 200 Å HTO disposable spacer layer after n-type source/drain implants and before p-type source/drain implants on Cypress Semiconductor 0.13 μm proprietary technology. The reduction in current leakage may enable, for example, low-leakage 5V P-MOSFETs to be integrated onto a process designed for 1.8V and 3.3V MOSFETs. As noted above, leakage current can be further improved by optimizing the disposable spacer thickness and source/drain implant conditions.

However, the improved processing method disclosed herein is not limited to the exemplary embodiments described above and shown in FIGS. 2-6. In one alternative embodiment, NMOS current leakage may be reduced by switching the source/drain implant order and depositing the disposable spacer layer after the source/drain regions are implanted on the PMOS side and before the source/drain regions are implanted of the NMOS side. This would increase the physical spacing between the gate and drain regions of the NMOS transistor, thereby reducing the NMOS gate/drain overlap. In another alternative embodiment, GIDL reduction can be obtained for both NMOS and PMOS by depositing the disposable spacer layer before any diffusion regions are formed. Regardless of the type of transistor being formed, the improved processing method described herein reduces GIDL without affecting the drive current or threshold voltage of the subsequently formed transistors.

FIGS. 7-12 illustrate an alternative sequence of process steps that may be used to fabricate transistors with independently customizable diffusion regions. In general, the process method shown in FIGS. 7-12 may be used to form two or more MOSFETs with reduced GIDL. Although three MOSFETs are shown, the method may be adapted to reduce GIDL within substantially any number and/or type of MOSFET. As but one advantage, MOSFET current leakage may be reduced without affecting the operating characteristics (e.g., drive current, threshold voltage) of nearby transistors (e.g., SONOS transistors, LVFETs and HVFETs to name a few).

In some cases, the processing method shown in FIGS. 7-12 may begin by forming two or more gate structures and associated sidewall spacers upon a semiconductor layer. In the particular embodiment of FIG. 7, three distinct sets of gate structures (310a, 310b, 310c) and associated sidewall spacers (318) are formed upon a semiconductor layer (320) of the semiconductor topography (300). The gate structures and sidewall spacers may generally be formed as described above in reference to FIG. 2.

Figure 7:
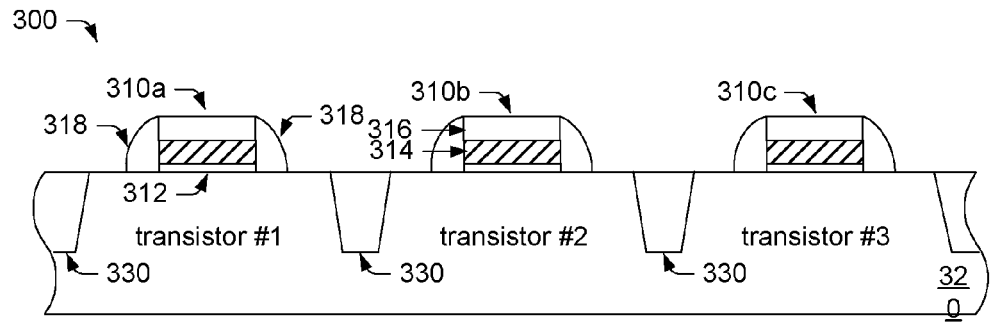
FIG. 7 is a partial cross-sectional view of another exemplary semiconductor topography in which three (or more) gate structures and associated sidewall spacers are formed upon a semiconductor layer.

In the embodiment of FIG. 7, the gate structures and sidewall spacers represent three distinct transistors (i.e., transistor #1, transistor #2, and transistor #3). In some cases, each of the transistors may be separated by an isolation region (330), as shown in FIG. 7. However, this might not always be the case. In some embodiments, all transistors may be of the same type (e.g., all NMOS or all PMOS). However, one or more of the transistors may be of a different type (e.g., a combination of NMOS/PMOS, a low voltage MOS or a high voltage MOS), in other embodiments of the invention.

Figure 8:
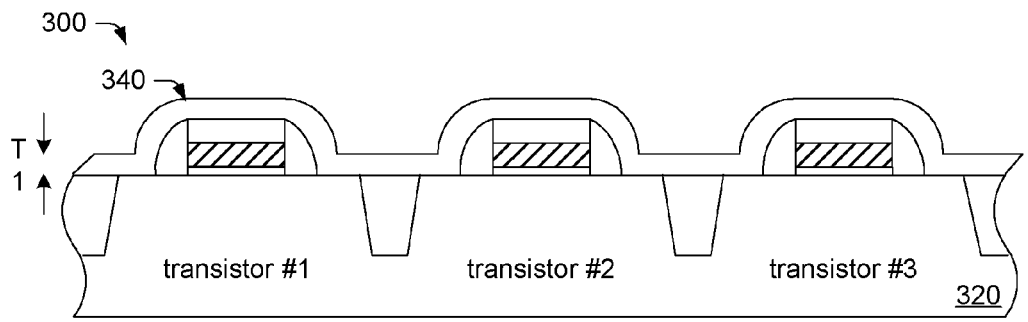
FIG. 8 is a partial cross-sectional view of the semiconductor topography of FIG. 7 in which a disposable spacer layer is deposited over the semiconductor topography to a first thickness.

In general, the process method shown in FIGS. 7-12 allows a circuit designer to customize each transistor independently. Like the previous method, the current method uses a disposable spacer layer 340 as a mask during implantation of the transistor source/drain regions to reduce GIDL by reducing the gate/drain overlap. The disposable spacer layer 340 is deposited sometime after the gate structures and sidewall spacers are formed. In some cases, the deposition of spacer layer 340 may occur before any transistor source/drain regions are formed, as shown in FIG. 8. In other cases, the deposition of the spacer layer may occur after one or more transistor source/drain regions are formed in accordance with the conventional method (i.e., by using only sidewall spacers 318 as an implant mask). The method disclosed herein includes all such embodiments and should not be limited to the exemplary embodiment shown in FIGS. 7-12.

Unlike the previous method, the current method provides enhanced flexibility and customizability by providing a means for varying the thickness of the disposable spacer layer in between implantations. For example, disposable spacer layer 340 may be formed by depositing a conductive material (e.g., polysilicon) or dielectric material (e.g., oxide, nitride or silicon nitride) to a first depth or thickness (T1). Regardless of material composition, the selectivity of disposable spacer layer 340 should differ significantly from that of sidewall spacers 318, dielectric cap layer 316 and semiconductor layer 320. Disposable spacer layer 340 may be deposited in accordance with any of the methods described above in reference to FIG. 4. In one embodiment, disposable spacer layer 340 may be deposited to a thickness of about 50 Å to about 500 Å.

Once the disposable spacer layer 340 is deposited, source/drain regions may be formed by implanting a first set of dopants into semiconductor layer 320. As noted above, the dopant implantation process may include a single implantation or a series of implantations. A series of implantations may be used, for example, to form graded junctions. In some embodiments, the dopants may be implanted into the entirety of semiconductor topography 300. In other embodiments, portions of semiconductor topography 300 may be masked prior to the dopant implantation to shield other portions of the semiconductor topography from the implantation.

Figure 9:
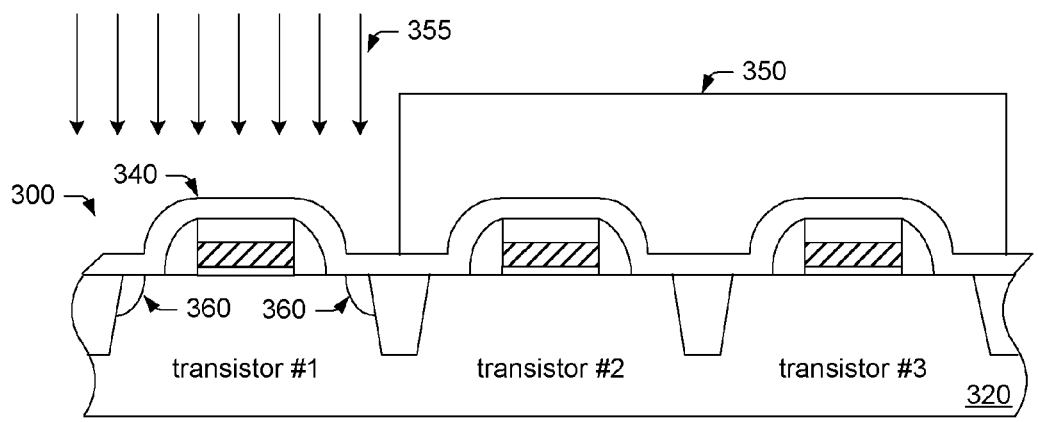
FIG. 9 is a partial cross-sectional view of the semiconductor topography of FIG. 8 in which diffusion regions are formed within a first transistor by masking the second and third transistors and using the sidewall spacers and disposable spacer layer as a mask during implantation of the first transistor.

In the embodiment of FIG. 9, portions of the semiconductor topography corresponding to transistors #2 and #3 are masked with photoresist 350 before dopants 355 are implanted into semiconductor layer 320 to form the source/drain regions 360 for transistor #1. Because disposable spacer layer 340 was deposited prior to implantation, source/drain regions 360 are laterally spaced away from the outer surfaces of the sidewall spacers 318 by an amount, which depends (at least in part) on the thickness of disposable spacer layer 340.

In some cases, the physical spacing between the gate and source/drain regions of transistor #1 may be relatively large when disposable spacer layer 340 is deposited to a relatively large thickness. Photoresist 350 may be removed after the implantation, as described above in reference to FIG. 5.

Figure 10:
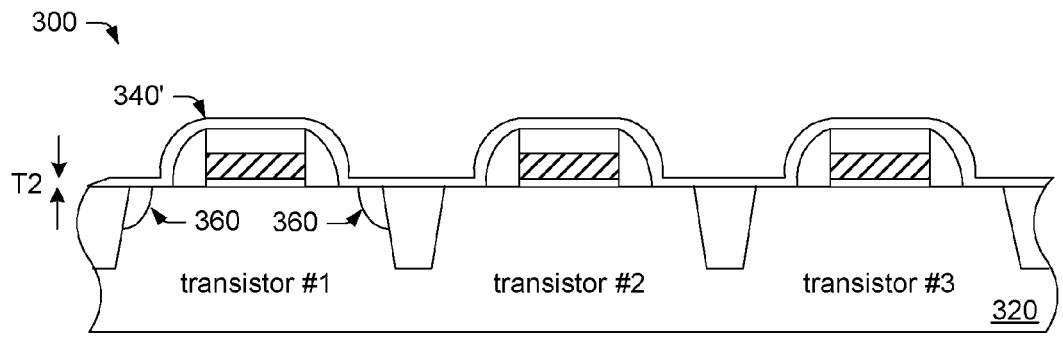
FIG. 10 is a partial cross-sectional view of the semiconductor topography of FIG. 9 in which the disposable spacer layer is reduced to a second thickness.

Next, the method may form source/drain regions within another portion of the semiconductor topography by implanting a second set of dopants into semiconductor layer 320. In some cases, the method may increase the gate/drain overlap within one or more of the remaining transistors by reducing the thickness (T2) of the disposable spacer layer (340') prior to implantation, as shown in FIG. 10. For example, a wet or dry etch process may be used to form disposable spacer layer 340' with a substantially smaller thickness (T2) than the initial deposition thickness (T1) of disposable spacer layer 340. In one embodiment, the semiconductor topography may be exposed to a wet chemistry (e.g., HF) for an amount of time needed to sufficiently reduce the thickness of the disposable spacer layer. However, the thickness of disposable spacer layer 340' may be increased in other embodiments of the invention (not shown). For example, an additional layer of spacer material may be deposited upon the semiconductor topography to increase the spacer layer thickness.

Figure 11:
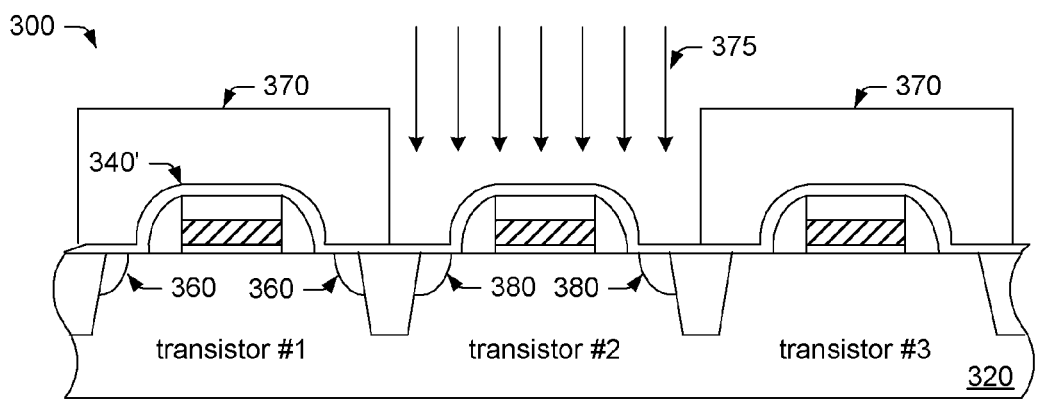
FIG. 11 is a partial cross-sectional view of the semiconductor topography of FIG. 10 in which diffusion regions are formed within the second transistor by masking off the first and third transistors and using the sidewall spacers and the reduced depth disposable spacer layer as a mask during implantation of the second transistor.
Figure 12:
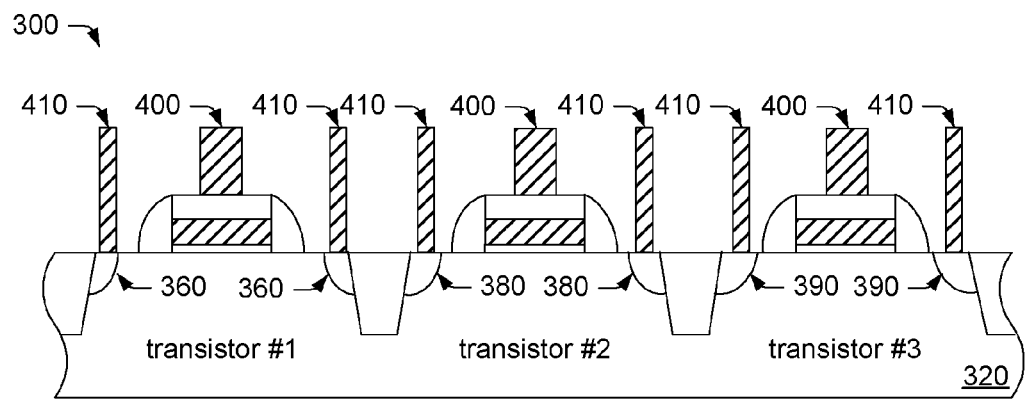
FIG. 12 is a partial cross-sectional view of the semiconductor topography of FIG. 11 after diffusion regions are formed within the third transistor, the disposable spacer layer is removed, and source, drain and gate contacts are formed upon the semiconductor topography.

Once the spacer layer thickness is changed, portions of the semiconductor topography may be masked before the second implantation. In the embodiment of FIG. 11, portions of the semiconductor topography corresponding to transistors #1 and #3 are masked with photoresist 370 before dopants 375 are implanted into semiconductor layer 320 to form the source/drain regions 380 for transistor #2. Because disposable spacer layer 340' was deposited prior to implantation, source/drain regions 380 are laterally spaced away from the outer surfaces of the sidewall spacers 318 by an amount, which depends (at least in part) on the thickness of disposable spacer layer 340'.

In some cases, the physical spacing between the gate and source/drain regions of transistor #2 may be somewhat smaller than the physical spacing between the gate and source/drain regions of transistor #1, due to the decreased thickness of disposable spacer layer 340' vs. disposable spacer layer 340. In some cases, the reduced physical spacing between the gate and source/drain regions of transistor #2 may result in a somewhat larger gate/drain overlap, and thus, a somewhat larger gate induced drain leakage (GIDL) for transistor #2 compared to transistor #1. However, the opposite may be true in the embodiments, which increase (rather than decrease) the thickness of disposable spacer layer 340'. After implantation, photoresist 370 may be removed as described above.

In some cases, the source and drain regions 390 for transistor #3 may be formed concurrently with the source and drain regions 380 for transistor #2. For example, portions of photoresist 370 overlying transistor #3 may be eliminated from FIG. 11, thereby allowing the second set of dopants to be implanted into the source/drain regions of transistor #3. In such cases, transistor #3 may demonstrate a gate/drain overlap, and thus, a gate induced drain leakage similar to that of transistor #2.

In other cases, the method steps described above in reference to FIGS. 10 and 11 may be repeated to allow transistor #3 to be independently customized. For example, the thickness of the disposable spacer layer may be further reduced (or increased) before conducting a third implantation step (not shown). In one embodiment, the disposable spacer layer is further reduced, transistors #1 and #2 are masked and a third set of dopants are forwarded into the exposed portions of the semiconductor layer 320 to form source/drain regions 390 for transistor #3. As such, transistor #3 may be configured with a substantially larger gate/drain overlap, and thus, a substantially larger GIDL than transistors #1 and #2. However, the opposite may be true in other embodiments of the invention.

The implantation energy used to form source/drain regions 360, 380, and 390 is generally dependent on the thickness of the disposable spacer layer used during each respective implant. For example, the implantation energy may be increased to account for thicker spacer layers or decreased for thinner spacer layers. One skilled in the art would recognize how a particular implantation energy could be tailed for a particular implant mask thickness.

In some cases, semiconductor topography 300 may be subjected to an anneal process to activate the dopants and eliminate any defects that may have been created during the implantation steps. In some cases, the anneal process may include a rapid thermal anneal (RTA) process. Such an anneal process usually causes the diffusion regions to extend wider and/or deeper into the semiconductor layer 320. However, by using disposable spacer layer 340, the present method ensures that the source/drain regions will not extend beneath the gate structures of transistors #1, #2 and #3. In other words, disposable spacer layer 340 may be used to reduce the effects of GIDL in the transistors by preventing excessive diffusion and reducing their respective gate/drain overlap.

As noted above, the disposable spacer layer may be removed from the semiconductor topography before or after the anneal process. For example, the disposable spacer layer may be removed by subjecting the semiconductor topography to a wet or dry cleaning process with a much higher selectivity to the disposable spacer layer than to underlying structures of the semiconductor topography. By selecting a cleaning process with a higher selectivity to the disposable spacer layer, the cleaning process ensures that the entire disposable spacer layer is removed before contact structures are formed, thereby avoiding electrical contact problems between the contact structures and the gate and source/drain regions of the transistors.

Once the disposable spacer layer 340 is removed, the fabrication sequence may continue with the deposition of a dielectric layer (not shown) and the formation of contact openings through the dielectric layer to expose the gate contact regions and the source/drain contact regions. As noted above, the dielectric layer can be any suitable dielectric material having the desired electrical and mechanical properties (e.g., undoped silicon dioxide or lightly doped phosphosilicate glass, PSG). After etching the dielectric layer to form contact openings, contact structures 400 and 410 may be formed (see FIG. 12) by filling the contact openings with any suitable metal or conductive material(s) having the desired electrical and mechanical properties (e.g., titanium/titanium-nitride liner and a tungsten plug). The resulting surface of the substrate may then be polished to complete the fabrication process.

It will be appreciated to those skilled in the art having the benefit of this disclosure that this invention is believed to provide an improved semiconductor topography and method for reducing gate induced drain leakage (GIDL) within MOS transistors. More specifically, the invention uses a disposable spacer layer as an additional mask during implantation of one or more source/drain regions. The physical spacing between the gate and source/drain regions of a MOS transistor (i.e., the gate/drain overlap) may be varied by varying the thickness of the disposable spacer layer. For example, a larger spacer layer thickness may be used to decrease the gate/drain overlap and reduce the GIDL associated with the MOS transistor. A method is also provided herein for independently customizing the current leakage associated with two or more MOS transistors.

Further modifications and alternative embodiments of various aspects of the invention will be apparent to those skilled in the art in view of this description. It is intended, therefore, that the following claims be interpreted to embrace all such modifications and changes and, accordingly, the specification and drawings are to be regarded in an illustrative rather than a restrictive sense.

What is claimed is:

1. A method of processing a semiconductor topography, the method comprising:
    forming one or more gate structures with associated sidewall spacers upon a semiconductor layer;
    depositing a disposable spacer layer upon the one or more gate structures, the sidewall spacers and adjacent portions of the semiconductor layer;
    implanting a first set of dopants into the semiconductor layer to form a first set of source and drain regions, whose boundaries are laterally spaced from the sidewalls of a
    first one of the gate structures by a distance determined, at least in part, by a combined thickness of the disposable spacer layer and a sidewall spacer formed adjacent to the first one of the gate structures;
    altering a thickness of the disposable spacer layer;
    masking a portion of the semiconductor topography comprising the first one of the gate structures and the first set of source and drain regions; and
    implanting a second set of dopants into the semiconductor layer to form a second set of source and drain regions, whose boundaries are laterally spaced from the sidewalls of a second one of the gate structures by a distance determined, at least in part, by a combined thickness of the altered disposable spacer layer and a sidewall spacer formed adjacent to the second one of the gate structures.

2. The method as recited in claim 1, wherein the step of altering comprises reducing the thickness of the disposable spacer layer, such that a relatively smaller lateral spacing exists between the second one of the gate structures and the boundaries of the second set of source and drain regions than the first one of the gate structures and the boundaries of the first set of source and drain regions.

3. The method as recited in claim 1, wherein the step of altering comprises increasing the thickness of the disposable spacer layer, such that a relatively larger lateral spacing exists between the second one of the gate structures and the boundaries of the second set of source and drain regions than the first one of the gate structures and the boundaries of the first set of source and drain regions.

4. The method as recited in claim 1, wherein prior to the step of depositing, the method comprises implanting a third set of dopants into the semiconductor layer to form a third set of source and drain regions, whose boundaries are laterally spaced from the sidewalls of a third one of the gate structures by a distance, which is determined by a thickness of a sidewall spacer formed adjacent to the third one of the gate structures.

5. The method as recited in claim 1, further comprising removing an entirety of the disposable spacer layer from the semiconductor topography prior to forming one or more contact structures upon the semiconductor topography.

6. A semiconductor topography, comprising:
    a first gate structure having spacers formed adjacent to sidewalls of the first gate structure;
    a first set of source and drain regions, whose boundaries are laterally spaced from the sidewalls of the first gate structure by a first distance, which is determined by a combined thickness of a spacer formed adjacent to one sidewall of the first gate structure and a disposable spacer layer, which is formed upon the semiconductor topography prior to forming the first set of source and drain region and entirely removed prior to forming an interlevel dielectric layer upon the topography, wherein the first set of source and drain region are formed by implantation of dopants through a portion of the disposable spacer layer;

one or more contact structures formed within the interlevel dielectric layer and in contact with the first gate structure and the first set of source and drain regions;

a second gate structure having spacers formed adjacent to sidewalls of the second gate structure; and a second set of source and drain regions, whose boundaries are laterally spaced from the sidewalls of the second gate structure by a second distance, which is determined by a thickness of a spacer formed adjacent to a sidewall of the second gate structure.

7. The semiconductor topography as recited in claim 6, wherein the first gate structure and the first set of source and drain regions comprise an PMOS transistor.

8. The semiconductor topography as recited in claim 6, wherein one of the contact structures formed in contact with the first gate structure comprises a self-aligned contact (SAC) structure.

9. The semiconductor topography as recited in claim 6, wherein the second gate structure and the second set of source and drain regions comprise an NMOS transistor.

10. A method comprising:
forming gate structures upon a semiconductor layer;
forming spacers adjacent to sidewalls of the gate structures;
implanting dopants into the semiconductor layer adjacent to a first gate structure to form a first set of source and drain regions, whose boundaries are laterally spaced from the sidewalls of the first gate structure by a distance determined by a thickness of the spacer formed adjacent thereto;
depositing a disposable spacer layer upon at least a second gate structure, the spacer formed adjacent thereto and adjacent portions of the semiconductor layer;
implanting dopants into the semiconductor layer through the disposable spacer layer to form a second set of source and drain regions, whose boundaries are laterally spaced from the sidewalls of the second gate structure by a distance determined by a combined thickness of the disposable spacer layer and the spacer formed adjacent to the second gate structure; and
removing an entirety of the disposable spacer layer from the semiconductor topography prior to forming one or more contact structures upon the semiconductor topography.

11. The method as recited in claim 10, wherein the disposable spacer layer comprises a conductive material.

12. The method as recited in claim 10, wherein the conductive material comprises polysilicon.

13. The method as recited in claim 10, wherein the second gate structure and the second set of source and drain regions comprise an PMOS transistor.

* * * * *